(12) United States Patent
Park et al.

(10) Patent No.: US 8,253,202 B2
(45) Date of Patent: Aug. 28, 2012

(54) THIN FILM TRANSISTOR SUBSTRATE AND METHOD OF MANUFACTURING THE SAME

(75) Inventors: Kyung-min Park, Yongin-si (KR); Chun-gi You, Hwasoong-si (KR)

(73) Assignee: Samsung Electronics Co., Ltd. (KR)

( * ) Notice: Subject to any disclaimer, the term of this patent is extended or adjusted under 35 U.S.C. 154(b) by 145 days.

(21) Appl. No.: 12/693,909

(22) Filed: Jan. 26, 2010

(65) Prior Publication Data
US 2010/0127329 A1 May 27, 2010

Related U.S. Application Data

(62) Division of application No. 11/502,806, filed on Aug. 11, 2006, now Pat. No. 7,682,881.

(30) Foreign Application Priority Data

Aug. 13, 2005 (KR) ......................... 10-2005-0074582

(51) Int. Cl.
*H01L 27/01* (2006.01)
*H01L 27/12* (2006.01)

(52) U.S. Cl. .......... 257/351; 257/350; 257/347; 257/72; 438/48; 438/149

(58) Field of Classification Search .......... 257/350–351, 257/347, 57, 59, 72, E27.112; 438/48, 149
See application file for complete search history.

(56) References Cited

U.S. PATENT DOCUMENTS

| | | | | |
|---|---|---|---|---|
| 6,747,325 B2 * | 6/2004 | Shih | ............................ | 257/408 |
| 2003/0025127 A1 * | 2/2003 | Yanai et al. | ................... | 257/158 |
| 2005/0074914 A1 * | 4/2005 | Chang et al. | ................... | 438/48 |
| 2007/0007524 A1 | 1/2007 | You et al. | | |
| 2008/0017937 A1 | 1/2008 | Morimoto et al. | | |

FOREIGN PATENT DOCUMENTS

| | | |
|---|---|---|
| JP | 07-131018 A | 5/1995 |
| JP | 09-252136 A | 9/1997 |
| JP | 2002-16261 | 1/2002 |
| JP | 2002-217419 A | 8/2002 |
| KR | 1020030025611 A | 3/2003 |
| KR | 2003-0076451 | 9/2003 |
| KR | 10-2004-0060501 | 7/2004 |
| KR | 1020050063079 A | 6/2005 |

* cited by examiner

*Primary Examiner* — Theresa T Doan
(74) *Attorney, Agent, or Firm* — Innovation Counsel LLP

(57) ABSTRACT

A thin film transistor substrate with good process efficiency and a method of manufacturing the same are provided. The thin film transistor substrate includes a first conductive type MOS transistor and a second conductive type MOS transistor. The first conductive type MOS transistor includes a first semiconductor layer formed on a blocking layer and having first conductive type low-concentration doping regions adjacent to both sides of a channel region, first conductive type source/drain regions adjacent to the first conductive type low-concentration doping regions, a first gate insulating layer formed on the first semiconductor layer, a second gate insulating layer formed on the first gate insulating layer and overlapping with the channel region and the low-concentration doping regions of the first semiconductor layer, and a first gate electrode formed on the second gate insulating layer. The second conductive type MOS transistor includes a second semiconductor layer formed on the blocking layer and having second conductive type source/drain regions adjacent to both sides of a channel region, the first gate insulating layer formed on the second semiconductor layer, a third gate insulating layer formed on the first gate insulating layer and overlapping with the second semiconductor layer, and a second gate electrode formed on the third gate insulating layer.

8 Claims, 11 Drawing Sheets

THIN FILM TRANSISTOR SUBSTRATE AND METHOD OF MANUFACTURING THE SAME

CROSS-REFERENCE TO RELATED APPLICATIONS

This is a divisional of U.S. patent application Ser. No. 11/502,806, filed on Aug. 11, 2006 now U.S. Pat. No. 7,682,881, which application claims priority from Korean Patent Application No. 10-2005-0074582 filed on Aug. 13, 2005 in the Korean Intellectual Property Office, the disclosures of which are incorporated herein by reference in their entirety.

BACKGROUND OF THE INVENTION

1. Field of the Invention

The present invention relates to a thin film transistor substrate and a method of manufacturing the same. More particularly, the present invention relates to a thin film transistor substrate with good process efficiency and a method of manufacturing the same.

2. Description of the Related Art

Recently, in liquid crystal displays (LCDs) used as display devices for notebook computers or other portable devices, driving methods thereof are shifting from a simple matrix type to an active matrix type. In particular, a thin-film transistor (TFT) active matrix driving method in which a plurality TFTs are formed on a glass substrate has become the mainstream technology for driving the LCDs.

A TFT generally includes a gate electrode as a part of a gate line, a semiconductor layer forming a channel, a source electrode as apart of a data line, and a drain electrode opposite the source electrode about the semiconductor layer. The TFT is generally used as a switching element for transmitting to or blocking from a pixel electrode a picture signal received through the data line by a scanning signal transferred through the gate line.

The semiconductor layer typically comprises amorphous silicon or polycrystalline silicon. Thin-film transistors are categorized into a bottom-gate type and a top-gate type according to the relative position of the semiconductor layer to a gate electrode. A polycrystalline silicon TFT is usually of a top gate type in which a gate electrode is formed above a semiconductor layer.

Along with the development of various crystallization techniques using lasers, such a polycrystalline silicon TFT can be manufactured in a temperature range similar to that of an amorphous silicon TFT while having higher electron or hole mobility than the amorphous silicon TFT, thereby realizing a Complementary Metal-Oxide Semiconductor (CMOS) TFT including an NMOS TFT with an n channel and a PMOS TFT with a p channel. Consequently, the polycrystalline silicon TFT can be utilized primarily for a driving circuit on a large-area glass substrate.

In conventional methods of manufacturing CMOS thin film transistors, however, the upper structures of semiconductor layers and ion implantation regions in the semiconductor layers of NMOS and PMOS transistors are formed using separate photolithography processes, which makes a manufacturing process complicated and increases manufacturing costs.

SUMMARY

The present invention provides a thin film transistor substrate with good process efficiency.

The present invention also provides a method of manufacturing a thin film transistor substrate with good process efficiency.

According to an aspect of the present invention, there is provided a thin film transistor substrate including a first conductive type MOS transistor and a second conductive type MOS transistor. The first conductive type MOS transistor includes a first semiconductor layer formed on a blocking layer and having first conductive type low-concentration doping regions adjacent to both sides of a channel region, first conductive type source/drain regions adjacent to the first conductive type low-concentration doping regions, a first gate insulating layer formed on the first semiconductor layer, a second gate insulating layer formed on the first gate insulating layer and overlapping with the channel region and the low-concentration doping regions of the first semiconductor layer, and a first gate electrode formed on the second gate insulating layer. The second conductive type MOS transistor includes a second semiconductor layer formed on the blocking layer and having second conductive type source/drain regions adjacent to both sides of a channel region, the first gate insulating layer formed on the second semiconductor layer, a third gate insulating layer formed on the first gate insulating layer and overlapping with the second semiconductor layer, and a second gate electrode formed on the third gate insulating layer.

According to another aspect of the present invention, there is provided a method of manufacturing a thin film transistor substrate, the method including providing a substrate wherein first and second semiconductor layers are formed on a blocking layer. Formed on the first semiconductor layer are a first ion implantation mask structure comprising a first gate insulating layer, a second gate insulating layer overlapping with a channel region and low-concentration doping regions of the first semiconductor layer, a first gate electrode overlapping with the channel region of the first semiconductor layer, and a first photoresist film pattern overlapping with the second gate insulating layer. Formed on the second semiconductor layer are a second ion implantation mask structure comprising the first gate insulating layer, a third gate insulating layer overlapping with the second semiconductor layer, a second gate electrode overlapping with a channel region of the second semiconductor layer, and a second photoresist film pattern overlapping with the second gate electrode, and forming second conductive type source/drain regions by injecting a high-concentration second conductive type impurity ion into the second semiconductor layer and into the blocking layer under the first semiconductor layer using the first and second ion implantation mask structures as ion implantation masks.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The above and other features and advantages of the present invention will become more apparent by describing in detail exemplary embodiments thereof with reference to the attached drawings in which.

Figure 1:
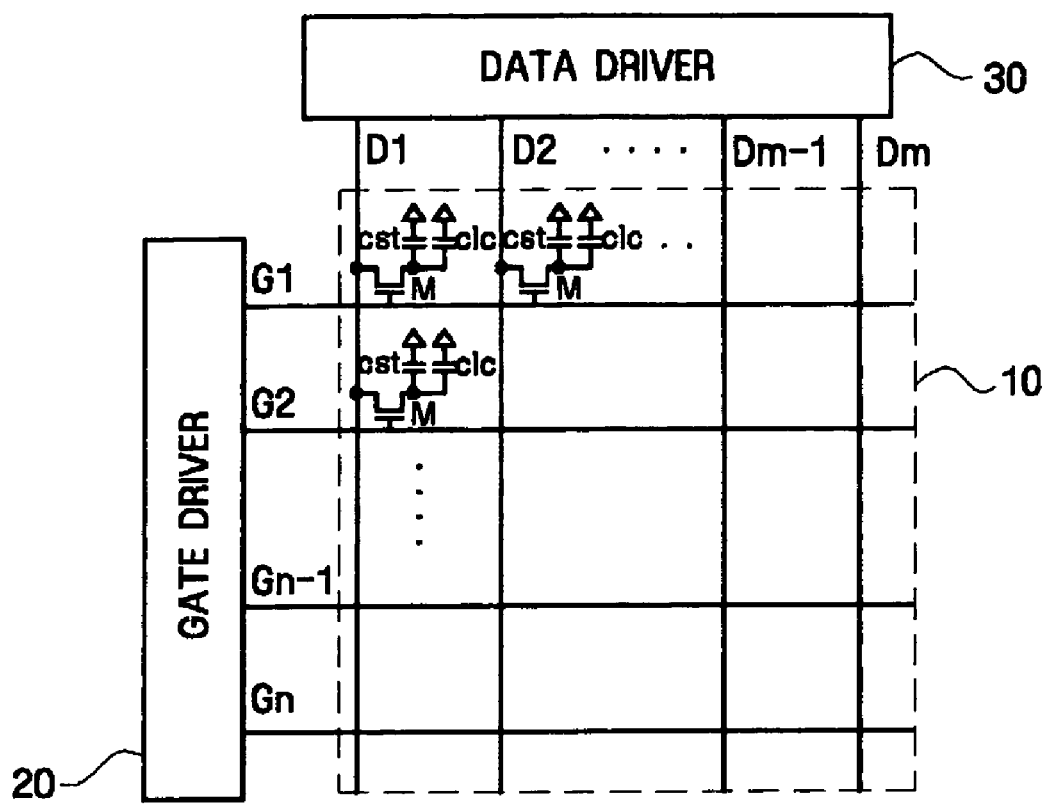
FIG. 1 is a schematic diagram illustrating a thin film transistor substrate according to an embodiment of the present invention.

Embodiments of the present invention and their advantages are best understood by referring to the detailed description that follows. It should be appreciated that like reference numerals are used to identify like elements illustrated in one or more of the figures. It should also be appreciated that the figures may not be necessarily drawn to scale.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It is noted that the use of any and all examples, or exemplary terms provided herein is intended merely to better illuminate the invention and is not a limitation on the scope of the invention unless otherwise specified. The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. It will be understood that when an element such as a layer, region or substrate is referred to as being "on" another element, it can be directly on the other element or intervening elements may also be present. Furthermore, relative terms such as "beneath" may be used herein to describe a relationship of one layer or region to another layer or region relative to a substrate or base layer as illustrated in the figures. In addition, the term "directly" means that there are no intervening elements. As used herein, the term "overlapping" refers to the state that when one of two structures which are formed in different layers is disposed at the same level as the other structure by a vertical access method, the area of one structure is substantially included in the area of the other structure. It can also be applied to the case where another structure is interposed between the two structures. Unless defined otherwise, all technical and scientific terms used herein have the same meaning as commonly understood by one of ordinary skill in the art to which this invention belongs. Further, unless defined otherwise, all terms defined in generally used dictionaries may not be overly interpreted.

Hereinafter, a thin film transistor substrate according to an embodiment of the present invention and a method of fabricating the same will be described in detail with reference to FIGS. 1 through 12.

FIG. 1 is a schematic diagram illustrating a thin film transistor substrate according to an embodiment of the present invention. Referring to FIG. 1, the thin film transistor substrate includes a pixel unit 10, a gate driver 20, and a data driver 30.

The pixel unit 10 includes a plurality of pixels connected to a plurality of gate lines G1, . . . , Gn and a plurality of data lines D1, . . . , Dm. Each pixel includes a switching device M connected to corresponding gate and data lines, and a liquid crystal capacitor Clc and a storage capacitor Cst connected to the switching device M.

The plurality of the gate lines G1, . . . , Gn extending in a row (or horizontal) direction are responsible for scan signal transmission to the switching device M, and the plurality of the data lines D1, . . . , Dm extending in a column (or vertical) direction are responsible for gray voltage (corresponding to an image signal) transmission to the switching device M. The switching device M is a three-terminal device in which a control terminal is connected to a corresponding gate line, an input terminal is connected to a corresponding data line, and an output terminal is connected to a terminal of the liquid crystal capacitor Clc and a terminal of the storage capacitor Cst. The liquid crystal capacitor Clc is connected between the output terminal of the switching device M and a common electrode (not shown), the storage capacitor Cst may be connected between the output terminal of the switching device M and the common electrode or between the output terminal of the switching device M and the adjacent upper gate line. The former type of the storage capacitor Cst is called a separate wire type, and the latter type of the storage capacitor Cst is called a previous gate type.

The gate driver 20 is connected to the plurality of the gate lines G1, . . . , Gn, and supplies a scan signal activating the switching device M to the plurality of the gate lines G1, . . . , Gn. The data driver 30 is connected to the plurality of the data lines D1, . . . , Dm.

Here, the switching device M may be a MOS transistor. The MOS transistor may be formed as a thin film transistor including a channel region comprising polycrystalline silicon. The gate driver 20 and the data driver 30 may also include MOS transistors. These MOS transistors may be formed as thin film transistors including a channel region comprising polycrystalline silicon.

Figure 2:
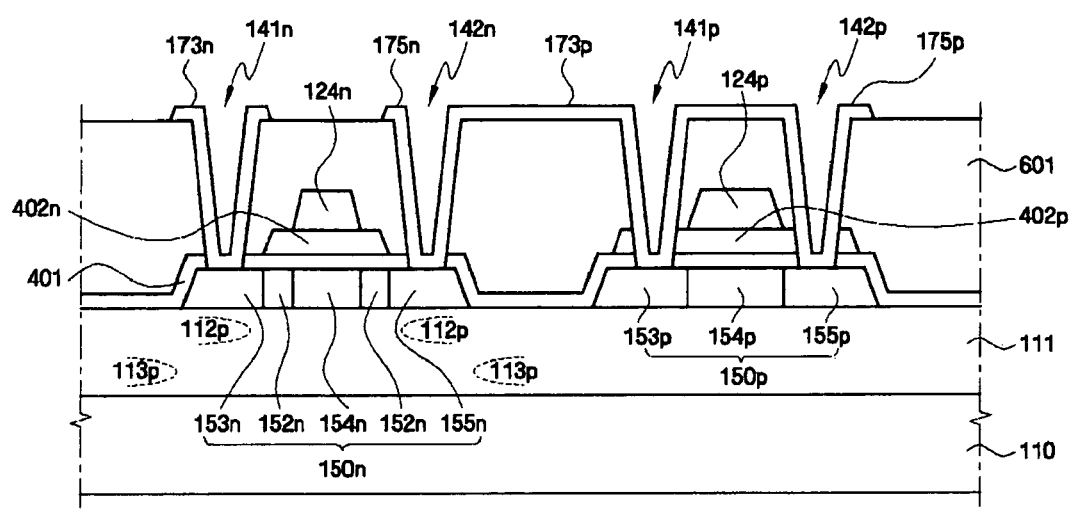
FIG. 2 is a sectional view of a driving unit of a thin film transistor substrate according to an embodiment of the present invention.

A thin film transistor substrate including a CMOS driving unit including NMOS and PMOS transistors having channel regions comprising polycrystalline silicon will be described with reference to FIG. 2. FIG. 2 is a sectional view of a driving unit of the thin film transistor substrate according to an embodiment of the present invention.

Referring to FIG. 2, a blocking layer 111 comprising silicon oxide or silicon nitride is formed on a transparent insulating substrate 110. First and second semiconductor layers 150n and 150p are formed on the blocking layer 111. In one example, the first semiconductor layer 150n includes source and drain regions 153n and 155n, respectively, doped with a high-concentration n-type impurity ion, and a polycrystalline silicon channel region 154n undoped with impurity ion. In another example, second semiconductor layer 150p includes source and drain regions 153p and 155p, respectively, doped with a high-concentration p-type impurity ion, and a polycrystalline silicon channel region 154p undoped with impurity ion.

With respect to an NMOS transistor, low-concentration doping regions 152n doped with a low-concentration n-type impurity ion are formed between the source region 153n and the channel region 154n and between the drain region 155n and the channel region 154n.

High-concentration p-type doping regions (e.g., 112p and 113p) formed by ion implantation with a high-concentration p-type impurity ion are present in portions of the blocking layer 111 under the source region 153n and the drain region 155n of the NMOS transistor. Peak doping concentrations 113p of the high-concentration p-type doping regions in the blocking layer 111 just under a first gate insulating layer 401 are at deeper depths than peak doping concentrations 112p of the high-concentration p-type doping regions in the blocking layer 111 just under the source region 153n and the drain region 155n of the NMOS transistor. A detailed description thereof will be provided later in a method of manufacturing a thin film transistor substrate.

The first gate insulating layer 401 (for example, comprising silicon oxide) is formed on the substrate 110 having thereon the first and second semiconductor layers 150n and 150p. Second gate insulating layers 402n and 402p (for example, comprising silicon nitride) are formed on the first gate insulating layer 401.

The reason why the above-described double-layered gate insulating layer structure is used is as follows. To reduce the threshold voltage (Vth) of a thin film transistor including a semiconductor layer made of polycrystalline silicon, it is necessary to form a gate insulating layer to a thin thickness. A conventional single-layered gate insulating layer comprising silicon oxide has a limitation in reduction of the threshold voltage of a thin film transistor due to low dielectric constant of 3.9. Furthermore, when a gate insulating layer is formed to a thin thickness to reduce the threshold voltage of a thin film transistor, a breakdown voltage is reduced, thereby increasing an electrostatic damage. Thus, in this embodiment, a gate insulating layer has a double-layered structure, i.e., the first gate insulating layer 401 comprising silicon oxide and the second gate insulating layers 402n and 402p comprising silicon nitride, which have about two times a higher dielectric constant than silicon oxide, to reduce the threshold voltage of thin film transistors and improve the performance of the thin film transistors.

The first gate insulating layer 401 covers the entire surface of the first and second semiconductor layers 150n and 150p comprising polycrystalline silicon. Then, first contact holes 141n and 141p and second contact holes 142n and 142p are formed in the first gate insulating layer 401 to electrically connect the source regions 153n and 153p and the drain regions 155n and 155p of the first and second semiconductor layers 150n and 150p, respectively, to source electrodes 173n and 173p and drain electrodes 175n and 175p, respectively, as will be further described later.

The second gate insulating layer 402n of the NMOS transistor is formed on the first gate insulating layer 401 to overlap with the channel region 154n and the low-concentration doping regions 152n adjacent to the channel region 154n in the first semiconductor layer 150n. The second gate insulating layer 402p of the PMOS transistor is formed on the first gate insulating layer 401 to overlap with the second semiconductor layer 150p. The first and second contact holes 141p and 142p of the PMOS transistor extend from the first gate insulating layer 401 to the second gate insulating layer 402p. In one embodiment, the thickness of each of the second gate insulating layers 402n and 402p must be equal to or greater than that of the first gate insulating layer 401. The reason will be described later in a method of manufacturing a thin film transistor substrate.

First and second gate electrodes 124n and 124p are respectively formed on the second gate insulating layers 402n and 402p of the NMOS and PMOS transistors. The first gate electrode 124n overlaps with the channel region 154n of the first semiconductor layer 150n, and the second gate electrode 124p overlaps with the channel region 154p of the second semiconductor layer 150p. An inter-insulating layer 601 is formed on the resultant structure having the first and second gate electrodes 124n and 124p. The first contact holes 141n and 141p and the second contact holes 142n and 142p formed in the first gate insulating layer 401 extend to the inter-insulating layer 601 to electrically connect the source regions 153n and 153p and the drain regions 155n and 155p to the source electrodes 173n and 173p and the drain electrodes 175n and 175p, respectively.

On the inter-insulating layer 601, there are formed the source electrode 173n of the NMOS transistor and the source electrode 173p of the PMOS transistor electrically connected to the source regions 153n and 153p via the first contact holes 141n and 141p, respectively, and the drain electrodes 175n and 175p, opposite to the source electrodes 173n and 173p with respect to the channel regions 154n and 154p, being electrically connected to the drain regions 155n and 155p via the second contact holes 142n and 142p, respectively. The drain electrode 175n of the NMOS transistor is connected to the source electrode 173p of the PMOS transistor.

Figure 3:
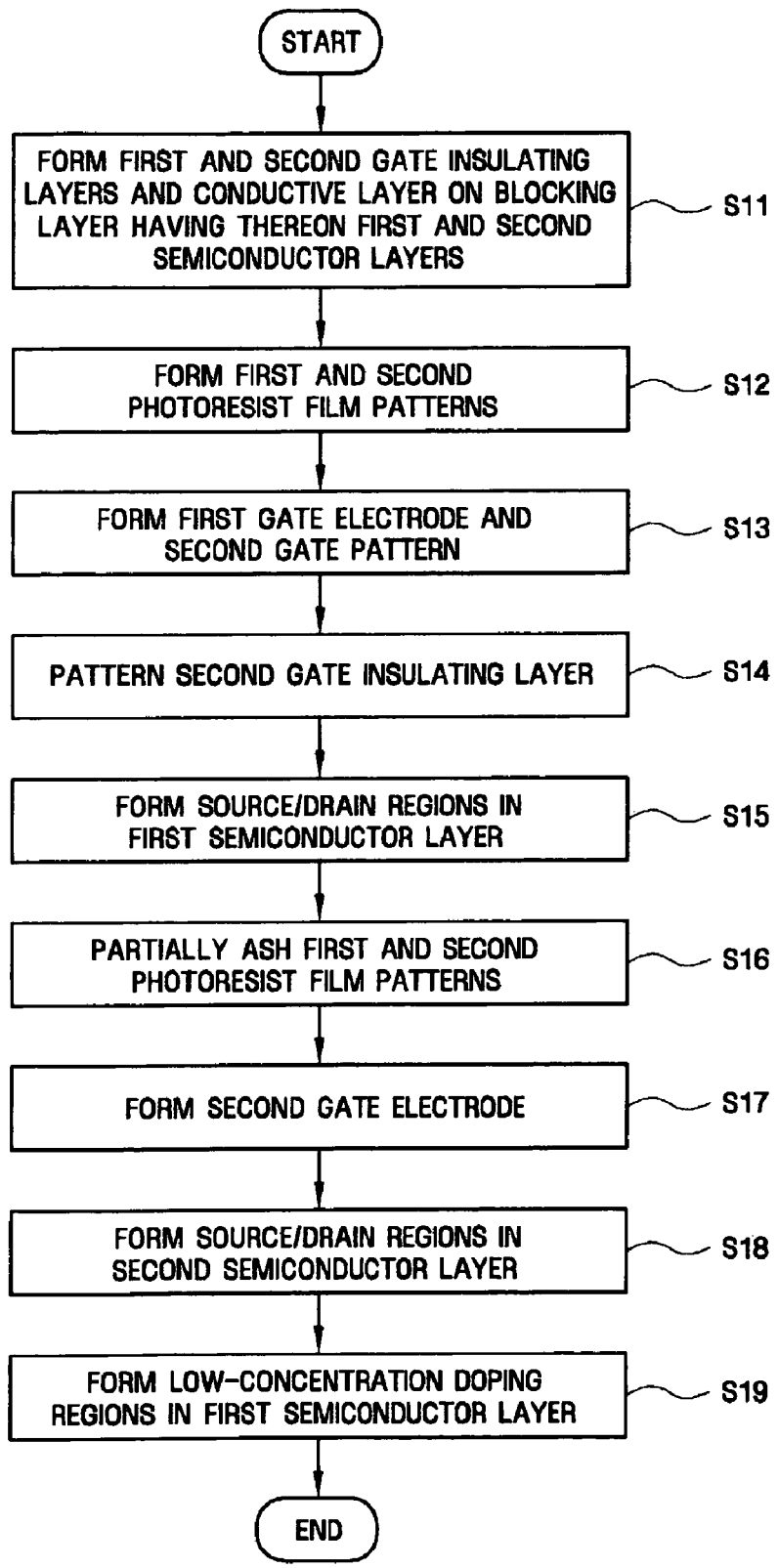
FIG. 3 is a flow diagram illustrating a method of manufacturing a thin film transistor substrate according to an embodiment of the present invention.

Now a method of manufacturing the thin film transistor substrate according to an embodiment of the present invention will be described in greater detail with reference to FIGS. 3 through 12. FIG. 3 is a flow diagram illustrating the method of manufacturing a thin film transistor substrate according to an embodiment of the present invention, and FIGS. 4 through 12 are sequential sectional views illustrating the method of manufacturing the thin film transistor substrate according to an embodiment of the present invention.

Referring to FIG. 3, a first gate insulating layer, a second gate insulating layer, and a gate conductive layer are sequentially formed on a blocking layer having thereon first and second semiconductor layers (operation S11).

Figure 4:
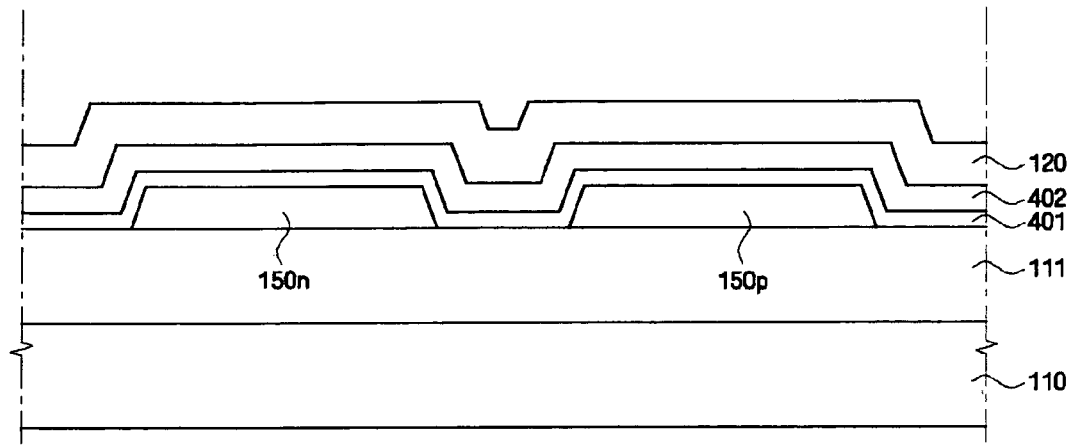
FIGS. 4 through 12 are sequential sectional views illustrating the method of manufacturing the thin film transistor substrate according to an embodiment of the present invention.

In more detail, referring to FIG. 4, a blocking layer 111 is formed on a transparent insulating substrate 110. The transparent insulating substrate 110 may be formed using glass, quartz, or sapphire, in one example, and the blocking layer 111 may be formed by deposition of silicon oxide ($SiO_2$) or silicon nitride ($SiN_x$) in another example. The blocking layer 111 serves to prevent the diffusion of impurity, etc. from the substrate 110 to first and second semiconductor layers 150n and 150p, and may be formed to a thickness of about 5,000 Å.

Then, amorphous silicon is formed to a thickness of, for example, about 500 Å on the blocking layer 111 to form an amorphous silicon layer. The amorphous silicon layer is crystallized by laser annealing, furnace annealing, or solid-phase crystallization, in one example, and patterned by photolithography, to form the first and second semiconductor layers 150n and 150p comprising polycrystalline silicon.

Then, silicon oxide and silicon nitride are sequentially deposited on the substrate 110 having thereon the first and second semiconductor layers 150n and 150p to form a first gate insulating layer 401 and a second gate insulating layer 402. In one embodiment, the thickness of the second gate insulating layer 402 must be equal to or greater than that of the first gate insulating layer 401. For example, when the thickness of the first gate insulating layer 401 is about 350 Å, the thickness of the second gate insulating layer 402 may be about 450 Å. However, the present invention is not limited to the above-illustrated example.

Then, a gate conductive layer 120 is formed on the second gate insulating layer 402. The gate conductive layer 120 may be formed as a single-layered film or a multi-layered film using aluminum, chromium, molybdenum, or an alloy thereof in one example. The gate conductive layer 120 may have a thickness of about 3,200 Å, but the present invention is not limited thereto. The thickness of the gate conductive layer 120 may be changed according to desired device characteristics.

Figure 5:
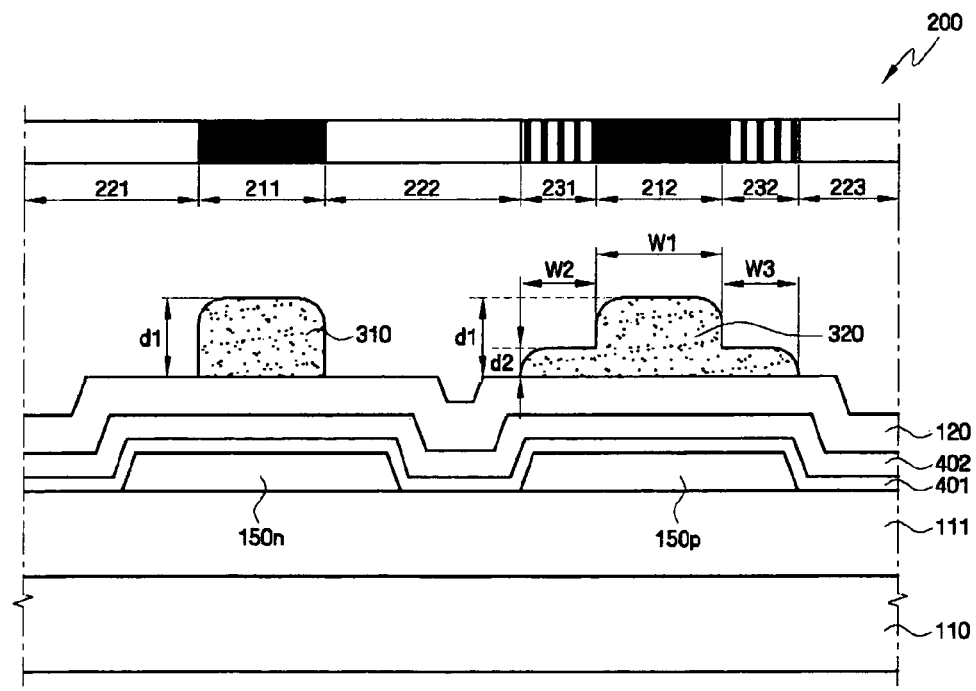

Next, first and second photoresist film patterns are formed on the conductive layer (see operation S12 shown in FIG. 3), as shown in FIG. 5.

Referring to FIG. 5, a photoresist film is formed on the gate conductive layer 120, exposed by photolithography using a photomask 200 including light-shielding portions 211 and 212, light-transmission portions 221, 222, and 223, and slit portions 231 and 232 for partial light transmission, and developed to form first and second photoresist film patterns 310 and 320. The first photoresist film pattern 310 is formed as a single-layered structure having a first thickness d1 on a portion of the gate conductive layer 120 corresponding to the light-shielding portion 211 of the photomask 200. A width of the first photoresist film pattern 310 may be changed according to a desired width of a channel region (see 154n shown in FIG. 2) to be formed in the first semiconductor layer 150n. A portion of the second photoresist film pattern 320 corresponding to the light-shielding portion 212 of the photomask 200 has the first thickness d1, whereas portions of the second photoresist film pattern 320 corresponding to the slit portions 231 and 232 of the photomask 200 have a second thickness d2. That is, the second photoresist film pattern 320 has a double-layered structure where an upper portion w1 has the first thickness d1 and lower portions w2 and w3 have the second thickness d2. A width of the upper portion w1 of the second photoresist film pattern 320 depends on a desired width of a channel region (see 154p shown in FIG. 2) to be formed in the second semiconductor layer 150p, and widths of the lower portions w2 and w3 depend on desired widths of source and drain regions (see 153p and 155p shown in FIG. 2) to be formed in the second semiconductor layer 150p.

The first and second photoresist film patterns 310 and 320 may be formed in various shapes according to desired purposes. For example, the first and second photoresist film patterns 310 and 320 may be formed to have a trapezoidal profile shape by patterning the photoresist film in a predetermined shape, followed by heating and shrinking. In another example, the first and second photoresist film patterns 310 and 320 may be formed to have a semispherical profile shape by heating a molten photoresist film. The first and second photoresist film patterns 310 and 320 can be used as etching masks for patterning the gate conductive layer 120 into gate electrodes, and, at the same time, as etching masks for forming second gate insulating layer. The first and second photoresist film patterns 310 and 320 can also be used as ion implantation masks for forming the source and drain regions of the first and second semiconductor layers 150n and 150p. This embodiment has been illustrated that the double-layered second photoresist film pattern 320 is formed using the photomask 200 including the slit portions 231 and 232, but the present invention is not limited to the above-illustrated example. The double-layered second photoresist film pattern 320 can also be formed using a halftone mask instead of slit mask portions 231 and 232.

Next, a first gate electrode and a second gate pattern are formed (operation S13 shown in FIG. 3).

Figure 6:
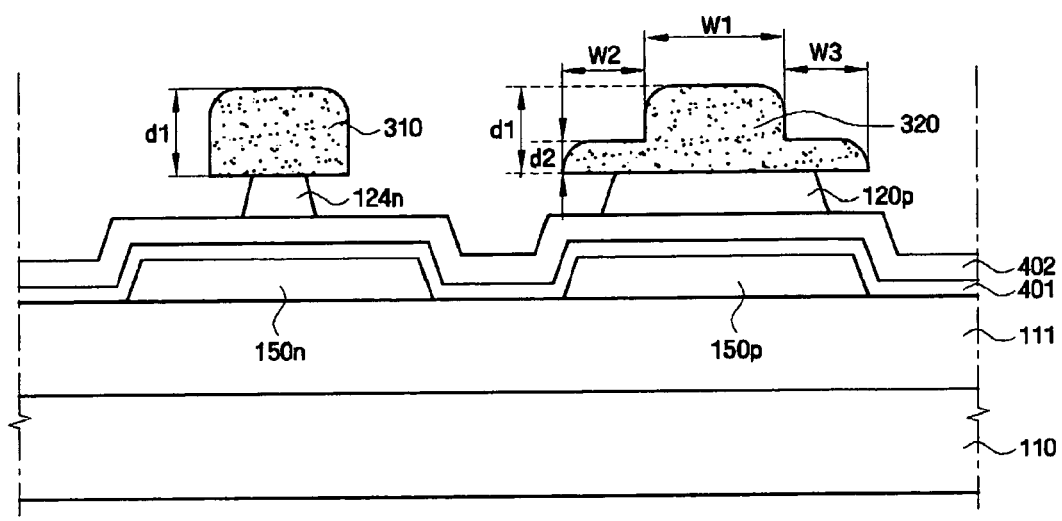

In more detail, referring to FIGS. 5 and 6, the gate conductive layer 120 is patterned using the first and second photoresist film patterns 310 and 320 as etching masks to form a first gate electrode 124n and a second gate pattern 120p. Sidewalls of the gate conductive layer 120 are over-etched by isotropic etching, e.g., wet-etching, to form the first gate electrode 124n and the second gate pattern 120p. The sidewalls of the first gate electrode 124n and the second gate pattern 120p may have tapered shapes to increase an adhesion with upper films to be formed in subsequent processes.

Next, the second gate insulating layer is patterned (operation S14 shown in FIG. 3).

Figure 7:
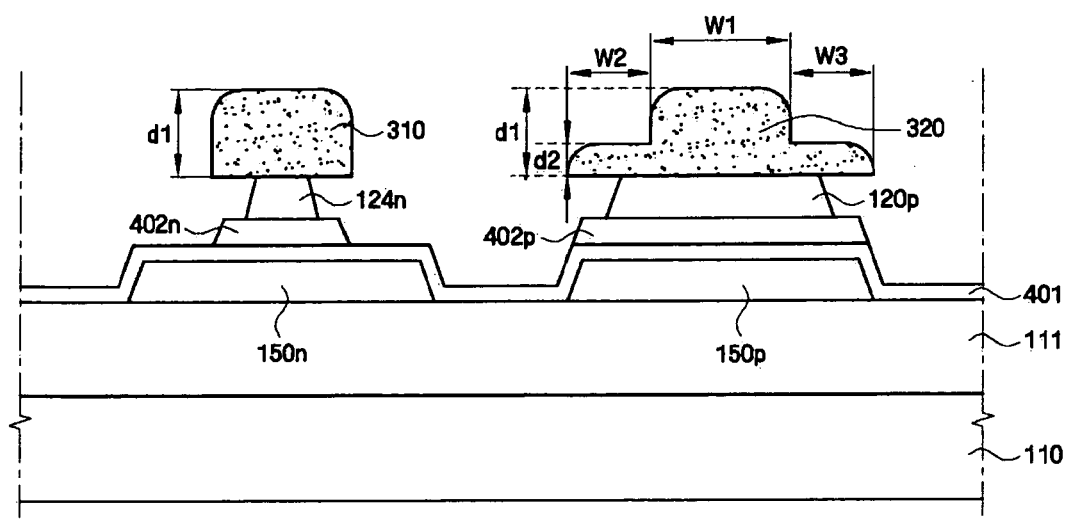

In more detail, referring to FIG. 7, the second gate insulating layer 402 is subjected to an etch back process using the first and second photoresist film patterns 310 and 320 as etching masks to form patterned second gate insulating layers 402n and 402p. The second gate insulating layer 402n formed beneath the first gate electrode 124n has a wider width than the first gate electrode 124n. Low-concentration doping regions as will be described later are defined by a width difference between the second gate insulating layer 402n and the first semiconductor layer 150n.

Next, a source region and a drain region are formed in the first semiconductor layer (operation S15 shown in FIG. 3).

Figure 8:
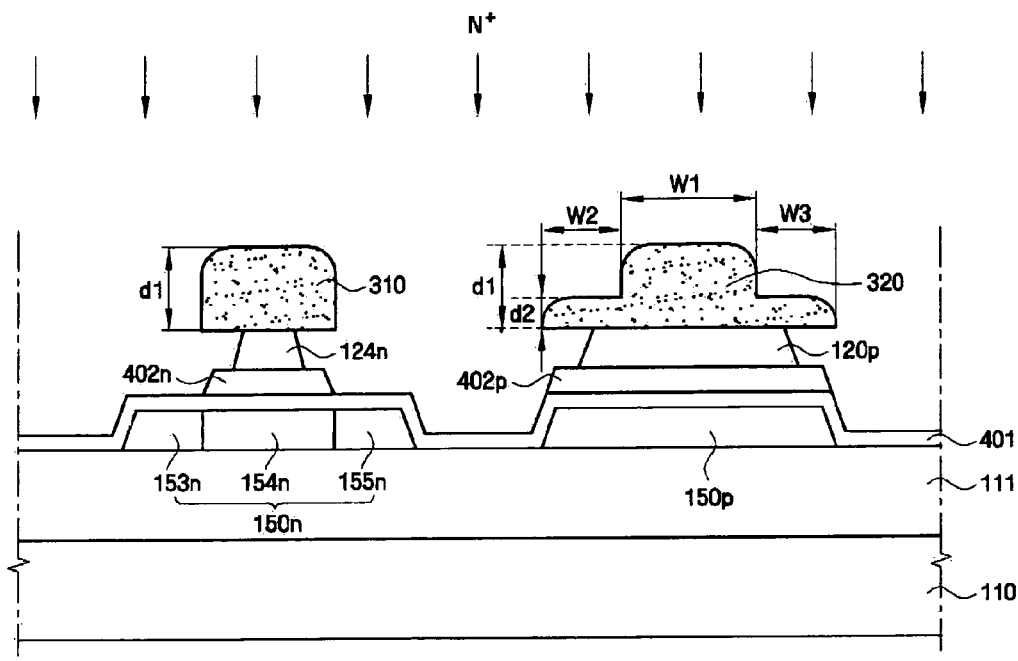

In more detail, referring to FIG. 8, a high-concentration n-type impurity ion $N^+$ is injected into the first semiconductor layer 150n using the first gate insulating layer 401, the second gate insulating layers 402n and 402p, the first gate electrode 124n, the second gate pattern 120p, and the first and second photoresist film patterns 310 and 320 as ion implantation masks to form a source region 153n, a drain region 155n, and a channel region 154n in the first semiconductor layer 150n. The channel region 154n is a portion of the first semiconductor layer 150n overlapping with the first photoresist film pattern 310 and separates the source region 153n and the drain region 155n and the n-type impurity ion $N^+$ is not injected thereinto. With respect to the second semiconductor layer 150p, the n-type impurity ion $N^+$ is not injected into the second semiconductor layer 150p due to an upper structure overlapping with the second semiconductor layer 150p. The n-type impurity ion $N^+$ may be $PH_3$, in one example, and an ion implantation dose and an ion implantation energy are adjusted according to desired device characteristics so that a peak doping concentration is formed in the first semiconductor layer 150n.

Next, the first and second photoresist film patterns are subjected to a partial ashing process (operation S16 shown in FIG. 3) and then a second gate electrode is formed on the second gate insulating layer 402p (operation S17 shown in FIG. 3).

Figure 9:
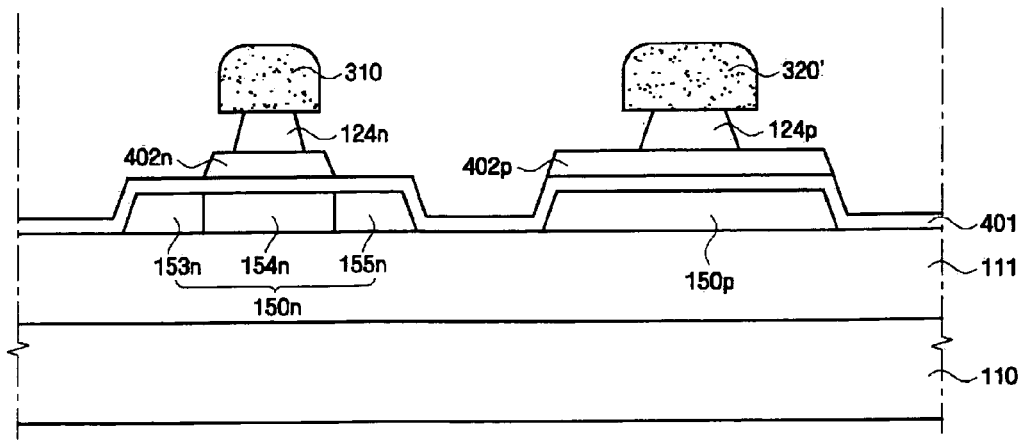

Referring to FIGS. 8 and 9, the first and second photoresist film patterns 310 and 320 are subjected to an ashing process to remove the lower portions w2 and w3 having the second thickness d2 and leave only the upper portion w1 in the second photoresist film pattern 320, resulting in a second photoresist film pattern 320'. Then, the second gate pattern 120p is patterned using the second photoresist film pattern 320' as an etching mask to form a second gate electrode 124p.

Next, a source region and a drain region are formed in the second semiconductor layer (operation S18 shown in FIG. 3).

Figure 10:
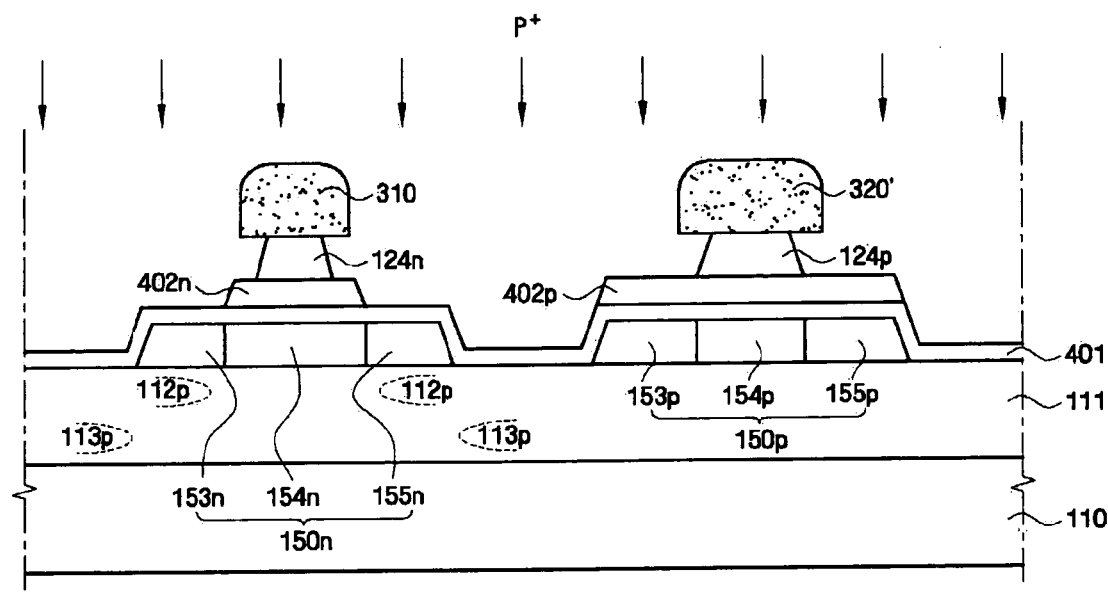

Referring to FIG. 10, a high-concentration p-type impurity ion $P^+$, e.g., $B_2H_6$, is injected into the second semiconductor layer 150p using the first gate insulating layer 401, the second gate insulating layers 402n and 402p, the first and second gate electrodes 124n and 124p, and the first and second photoresist film pattern 310 and 320' as ion implantation masks to form a source region 153p, a drain region 155p, and a channel region 154p in the second semiconductor layer 150p. The channel region 154p is a portion of the second semiconductor layer 150p overlapping with the second photoresist film pattern 320' and separates the source region 153p and the drain region 155p and the p-type impurity ion $P^+$ is not injected thereinto. To form the peak doping concentration of the p-type impurity ion $P^+$ in the second semiconductor layer 150p, the p-type impurity ion $P^+$ must be injected using a relatively high ion implantation energy since the first gate insulating layer 401 and the second gate insulating layer 402p are formed on the source region 153p and the drain region 155p of the second semiconductor layer 150p. On the other hand, since only the first gate insulating layer 401 is formed on the source region 153n and the drain region 155n of the first semiconductor layer 150n, the p-type impurity ion $P^+$ using relatively high ion implantation energy is also injected into the blocking layer 111 under the first semiconductor layer 150n. In this case, as the second gate insulating layers 402n and 402p become thicker than the first gate insulating layer 401, i.e., as a thickness difference between the first gate insulating layer 401 and the second gate insulating layers 402n and 402p increases, peak doping concentrations 112p and 113p of the p-type impurity ion $P^+$ in the blocking layer 111 under the first semiconductor layer 150n are at deeper depths. Furthermore, the peak doping concentrations 113p in the blocking layer 111 just under the first gate insulating layer 401 are at deeper depths relative to the peak doping concentrations 112p of the p-type impurity ion in the blocking layer 111 just under the source region 153n and the drain region 155n of the first semiconductor layer 150n.

Next, low-concentration doping regions are formed in the first semiconductor layer (operation S19 shown in FIG. 3).

Figure 11:
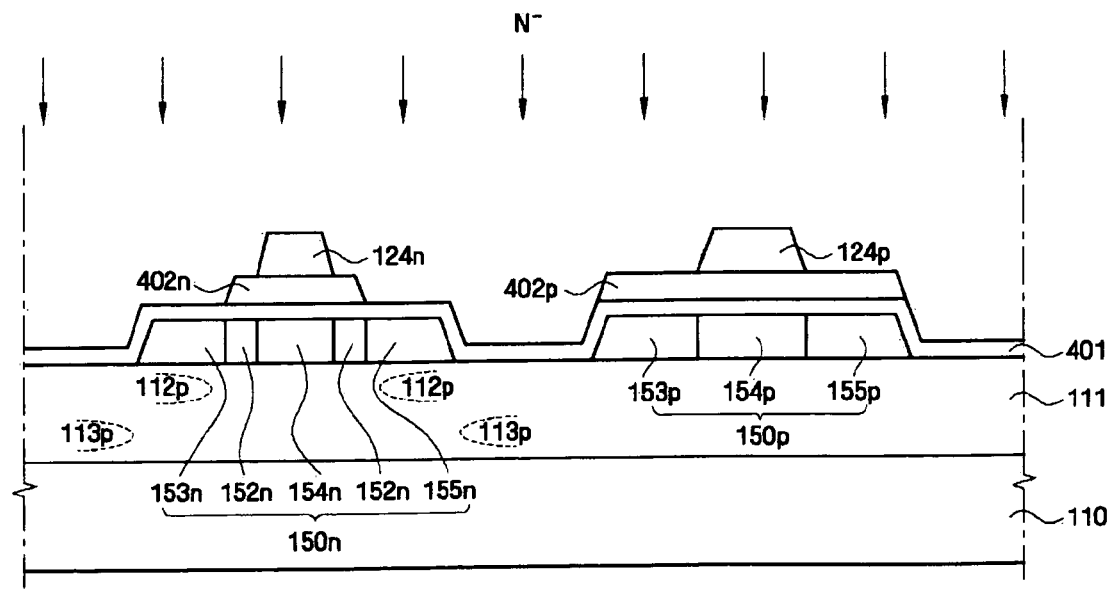

Referring to FIG. 11, a low-concentration n-type impurity ion $N^-$ is injected into the first semiconductor layer 150n using as an ion implantation mask the resultant structure in which the first photoresist film pattern 310 and the second photoresist film pattern 320' are removed, to form low-concentration doping regions 152n in the first semiconductor layer 150n.

Figure 12:
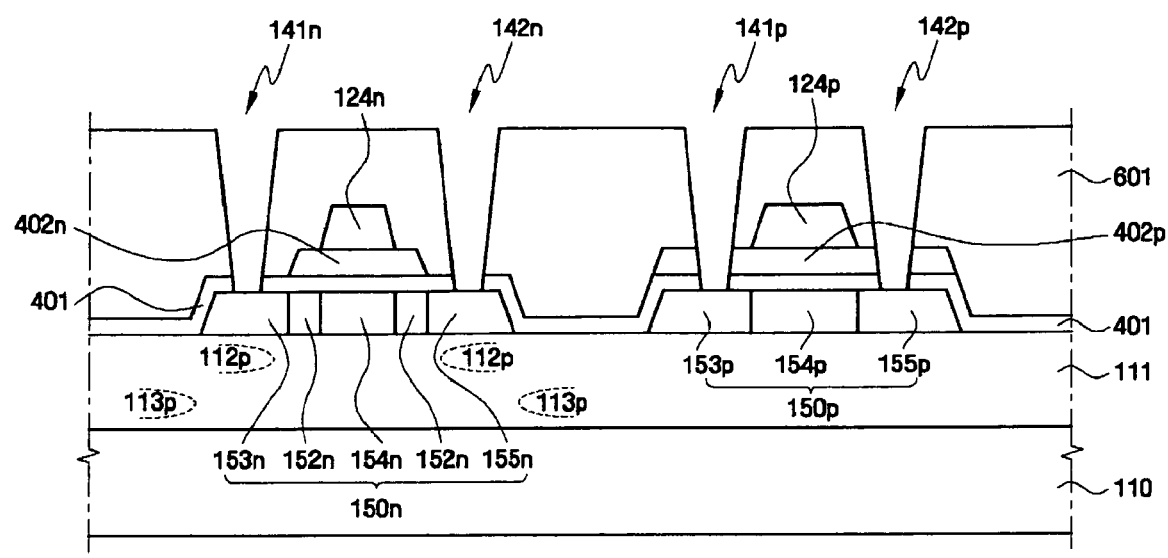

Next, referring to FIG. 12, the resultant structure having the low-concentration doping regions 152n is covered with an insulating material to form an inter-insulating layer 601. Then, the inter-insulating layer 601 is patterned by photolithography using a mask to form first contact holes 141n and 141p and second contact holes 142n and 142p exposing the source regions 153n and 153p and the drain regions 155n and 155p, respectively.

Next, turning to FIG. 2, a data conductive layer (not shown) is formed on the inter-insulating layer 601 and patterned by photolithography using a mask to form source electrodes 173n and 173p and drain electrodes 175n and 175p. The source electrodes 173n and 173p are respectively connected to the source regions 153n and 153p via the first contact holes 141n and 141p, respectively, and the drain electrodes 175n and 175p are connected to the drain regions 155n and 155p via the second contact holes 142n and 142p, respectively. The source electrodes 173n and 173p and the drain electrodes 175n and 175p are formed by forming a data conductive layer as a single layer made of aluminum (Al), Al-containing metal (Al alloy), molybdenum (Mo), or Mo alloy, in one example, or a multiple layer including an Al alloy layer and a chromium (Cr) or Mo alloy layer, in another example, and patterning the data conductive layer. The data conductive layer may be formed using the same conductive material and etching method as used for the gate conductive layer. The sidewall profiles of the source electrodes 173n and 173p and the drain electrodes 175n and 175p may have tapered shapes to increase an adhesion with upper films in subsequent processes.

Figure 13:
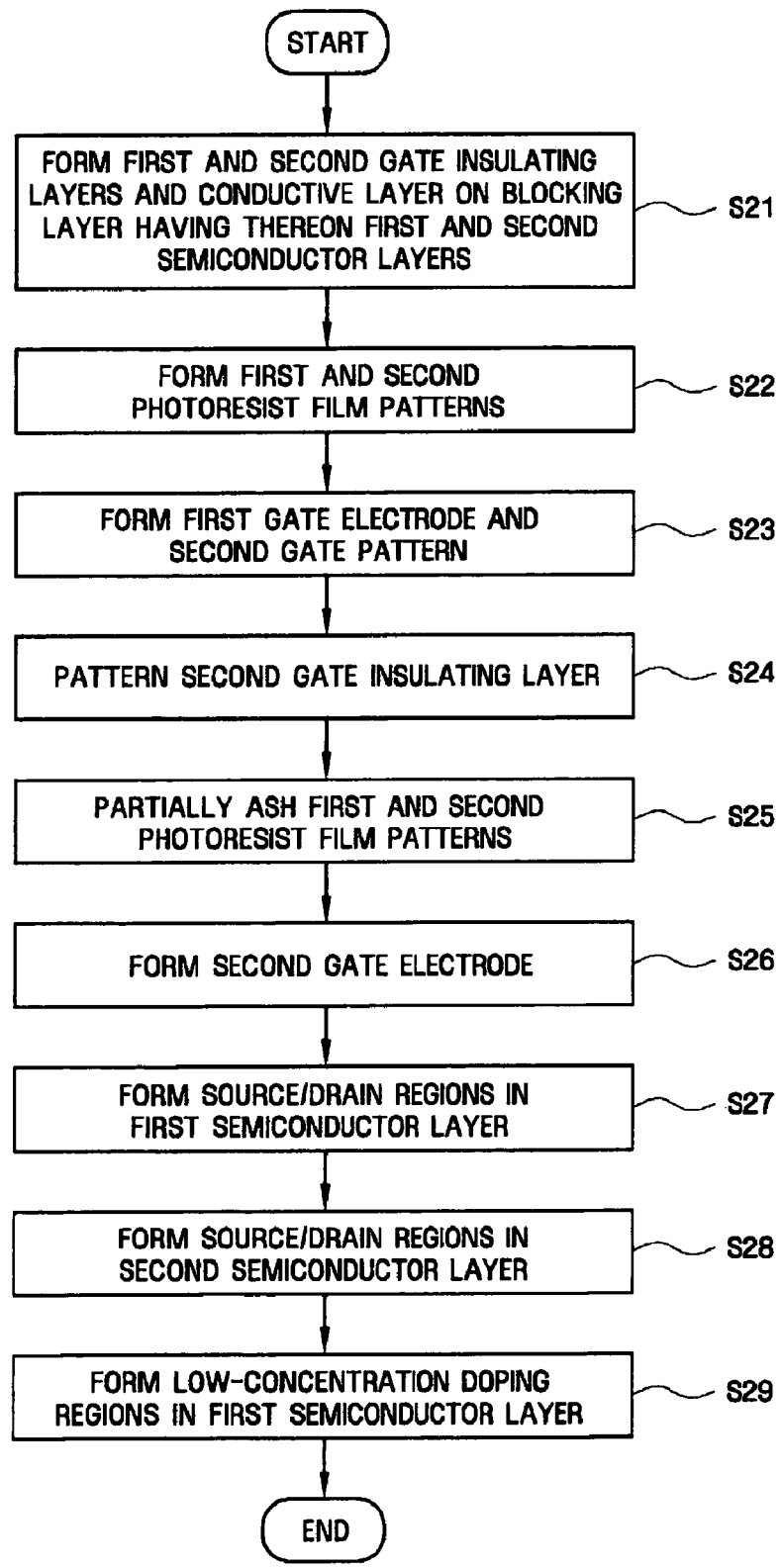
FIG. 13 is a flow diagram illustrating a method of manufacturing a thin film transistor substrate according to another embodiment of the present invention.
Figure 14:
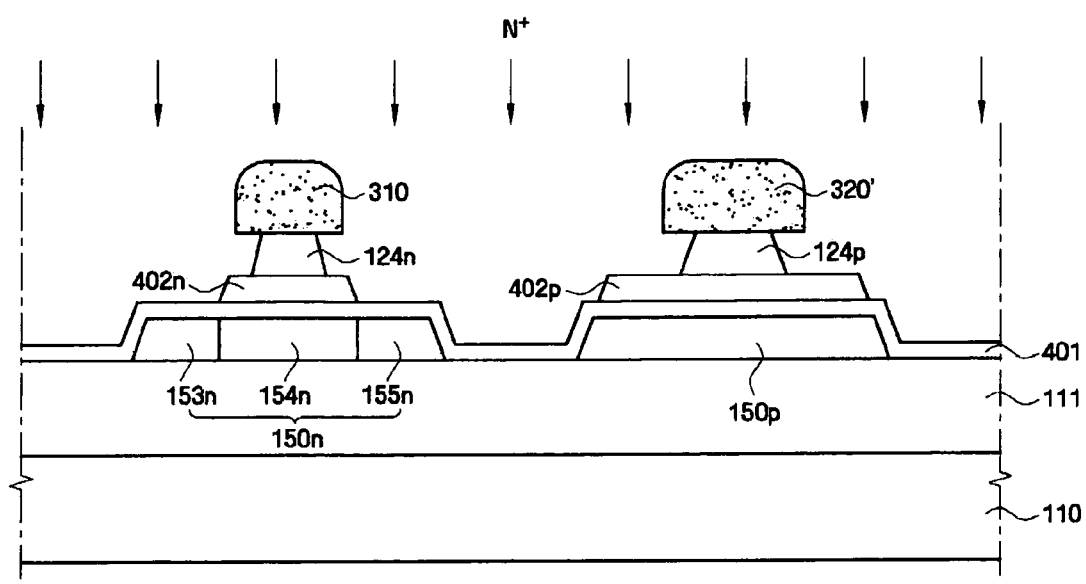
FIG. 14 is a sectional view of an intermediate structure formed in the method of manufacturing the thin film transistor substrate according to another embodiment of the present invention.

The present invention is described hereinafter with reference to flowchart illustrations of a method of manufacturing a thin film transistor substrate according to another embodiment of the invention. FIG. 13 is a flow diagram illustrating the method of manufacturing a thin film transistor substrate according to this embodiment of the present invention, and FIG. 14 is a sectional view of an intermediate structure formed in the method of manufacturing the thin film transistor substrate according to this embodiment of the present invention.

A method of manufacturing a thin film transistor substrate according to another embodiment of the present invention is substantially the same as that of the previous embodiment except that the forming of a source region and a drain region in a first semiconductor layer is performed immediately before forming a source region and a drain region in a second semiconductor layer. Thus, the features of this embodiment that differ from the previous embodiment will be described hereinafter with reference to FIGS. 4-7 and 9-14.

First, as shown in FIG. 4, first and second gate insulating layers 401 and 402 and a gate conductive layer 120 are sequentially formed on a blocking layer 111 having thereon first and second semiconductor layers 150n and 150p (see operation S21 shown in FIG. 13).

Next, as shown in FIG. 5, a first photoresist film pattern 310 is formed to a first thickness d1 on a portion of the gate conductive layer 120 overlapping with the first semiconductor layer 150n, and a second photoresist film pattern 320 is formed in a double-layered structure including an upper portion w1 with the first thickness d1 and lower portions w2 and w3 with a second thickness d2 thinner than the first thickness d1 on a portion of the gate conductive layer 120 overlapping with the second semiconductor layer 150p (see operation S22 shown in FIG. 13).

Next, as shown in FIG. 6, the gate conductive layer 120 is isotropically etched using the first and second photoresist film patterns 310 and 320 as etching masks to form a first gate electrode 124n and a second gate pattern 120p (see operation S23 shown in FIG. 13).

Next, as shown in FIG. 7, the second gate insulating layer 402 is patterned by an etch back process using the first and second photoresist film patterns 310 and 320 as etching masks to form patterned second gate insulating layers 402n and 402p (see operation S24 shown in FIG. 13).

Next, as shown in FIGS. 7 and 9, the first and second photoresist film patterns 310 and 320 are subjected to an ashing process to remove the lower portions w2 and w3 from the second photoresist film pattern 320, resulting in a second photoresist film pattern 320' (see operation S25 shown in FIG. 13).

Then, the second gate pattern 120p is patterned using the second photoresist film pattern 320' as an etching mask to form a second gate electrode 124p (see operation S26 shown in FIG. 13).

Next, as shown in FIG. 14, a source region 153n and a drain region 155n are formed in the first semiconductor layer 150n (see operation S27 shown in FIG. 13).

In more detail, a high-concentration n-type impurity ion $N^+$ is injected into the first semiconductor layer 150n using as ion implantation masks the first gate insulating layer 401, the second gate insulating layers 402n and 402p, the first and second gate electrodes 124n and 124p, and the first and second photoresist film patterns 310 and 320', to form the source region 153n, the drain region 155n, and a channel region 154n in the first semiconductor layer 150n. The n-type impurity ion $N^+$ may be $PH_3$ in one example. An ion implantation dose and an ion implantation energy are adjusted according to device characteristics so that a peak doping concentration can be formed in the first semiconductor layer 150n. Thus, the n-type impurity ion $N^+$ is not injected into the second semiconductor layer 150p covered with the second gate insulating layer 402p and the first gate insulating layer 401.

Next, as shown in FIG. 10, a high-concentration p-type impurity ion $P^+$, e.g., $B_2H_6$, is injected into the second semiconductor layer 150p using as an ion implantation mask the resultant structure in which the source region 153n and the drain region 155p are formed in the first semiconductor layer 150n, to form a source region 153p, a drain region 155p, and a channel region 154p in the second semiconductor layer 150p (see operation S28 shown in FIG. 13).

Next, as shown in FIG. 11, the first and second photoresist film patterns 310 and 320' are removed, and a low-concentration n-type impurity ion $N^-$, e.g., $PH_3$, is injected into the first semiconductor layer 150n using as an ion implantation mask the resultant structure wherein the first and second photoresist film patterns 310 and 320' are removed, to form low-concentration doping regions 152n (see operation S29 shown in FIG. 13).

Next, as shown in FIG. 12, the resultant structure having the low-concentration doping regions 152n is covered with an insulating material to form an inter-insulating layer 601. The inter-insulating layer 601 is patterned to form first contact holes 141n and 141p and second contact holes 142n and 142p exposing the source regions 153n and 153p and the drain regions 155n and 155p, respectively.

Next, as shown in FIG. 2, source electrodes 173n and 173p connected to the source regions 153n and 153p via the first contact holes 141n and 141p, respectively, and drain electrodes 175n and 175p connected to the drain regions 155n and 155p via the second contact holes 142n and 142p, respectively, are formed on the inter-insulating layer 601.

While the above-described embodiments have illustrated that the source and drain regions of a second semiconductor layer are formed after forming the source and drain regions of a first semiconductor layer, the present invention is not limited thereto. It should be understood that the source and drain regions of a second semiconductor layer can be formed prior to forming the source and drain regions of a first semiconductor layer.

Advantageously, according to the method of manufacturing a thin film transistor substrate of the present invention, since the formation of first and second gate insulating layers and first and second gate electrodes on a substrate having thereon first and second semiconductor layers and the formation of impurity ion implantation regions in the first and second semiconductor layers are achieved using only a single mask, process efficiency is increased, resulting in an increase in the yield and a reduction of manufacturing costs. In concluding the detailed description, those skilled in the art will appreciate that many variations and modifications can be made to the above-described embodiments without substantially departing from the principles of the present invention as set forth in the appended claims. Therefore, the disclosed embodiments of the invention are used in a generic and descriptive sense only and not for purposes of limitation.

What is claimed is:

1. A thin film transistor substrate, comprising:
a first conductive type MOS transistor including:
  a first semiconductor layer formed on a blocking layer and having first conductive type low-concentration doping regions adjacent to both sides of a channel region,
  first conductive type source/drain regions adjacent to the first conductive type low-concentration doping regions,
  a first gate insulating layer formed on the first semiconductor layer,
  a first portion of a second gate insulating layer formed on the first gate insulating layer and overlapping only with the channel region and the low-concentration doping regions of the first semiconductor layer, and
  a first gate electrode formed on the second gate insulating layer; and
a second conductive type MOS transistor including:
  a second semiconductor layer formed on the blocking layer and having second conductive type source/drain regions adjacent to both sides of a channel region,
  the first gate insulating layer formed on the second semiconductor layer,
  a second portion of the second gate insulating layer formed on the first gate insulating layer and overlapping with the second conductive type source/drain regions of the second semiconductor layer, and
  a second gate electrode formed on the second gate insulating layer.

2. The thin film transistor substrate of claim 1, wherein the thickness of the second gate insulating layer is equal to or greater than the thickness of the first gate insulating layer.

3. The thin film transistor substrate of claim 1, further comprising a second conductive type doping impurity under the first conductive type source/drain regions in the first semiconductor layer of the first conductive type MOS transistor.

4. The thin film transistor substrate of claim 1, wherein the first conductive type is n-type and the second conductive type is p-type.

5. The thin film transistor substrate of claim 1, wherein the first gate insulating layer comprises a silicon oxide film.

6. The thin film transistor substrate of claim 1, wherein the second gate insulating layer comprises a silicon nitride film.

7. The thin film transistor substrate of claim 1, wherein the second portion of the second gate insulating layer overlaps only with the second conductive type source/drain regions and channel region of the second semiconductor layer.

8. The thin film transistor substrate of claim 1, further comprising:
an inter-insulating layer formed on the first gate insulating layer, the second gate insulating layer, the first gate electrode and the second gate electrode;
a first contact hole in the inter-insulating layer exposing a portion of the first conductive type drain region;
a second contact hole in the inter-insulating layer exposing a portion of the second conductive type source region; and
an electrode layer formed on the inter-insulating layer, an exposed portion of the first conductive type drain region and an exposed portion of the second conductive type source region.

* * * * *